(12) United States Patent
Braeuninger-Weimer et al.

(10) Patent No.: US 12,239,030 B2
(45) Date of Patent: Feb. 25, 2025

(54) HIGH TEMPERATURE SUPERCONDUCTOR

(71) Applicant: Enterprise Science Fund, LLC, Bellevue, WA (US)

(72) Inventors: Philipp Braeuninger-Weimer, Seattle, WA (US); Nathan P. Myhrvold, Bellevue, WA (US); Conor L. Myhrvold, Bellevue, WA (US); Cameron Myhrvold, Bellevue, WA (US); Clarence T. Tegreene, Mercer Island, WA (US); Roderick A. Hyde, Redmond, WA (US); Lowell L. Wood, Jr., Bellevue, WA (US); Muriel Y. Ishikawa, Livermore, CA (US); Victoria Y. H. Wood, Livermore, CA (US); David R. Smith, Durham, NC (US); John Brian Pendry, Surrey (GB); Charles Whitmer, North Bend, WA (US); William Henry Mangione-Smith, Kirkland, WA (US); Brian C. Holloway, Snoqualmie, WA (US); Stuart A. Wolf, Bowie, MD (US); Vladimir Z. Kresin, Oakland, CA (US)

(73) Assignee: Enterprise Science Fund, LLC, Bellevue, WA (US)

( * ) Notice: Subject to any disclaimer, the term of this patent is extended or adjusted under 35 U.S.C. 154(b) by 0 days.

(21) Appl. No.: 18/483,504

(22) Filed: Oct. 9, 2023

(65) Prior Publication Data
US 2024/0122080 A1 Apr. 11, 2024

Related U.S. Application Data

(63) Continuation of application No. 16/268,388, filed on Feb. 5, 2019, now Pat. No. 11,785,866.
(Continued)

(51) Int. Cl.
 *H10N 60/85* (2023.01)
(52) U.S. Cl.
 CPC .................... *H10N 60/858* (2023.02)
(58) Field of Classification Search
 CPC .................... H10N 60/858; H10N 60/857
 See application file for complete search history.

(56) References Cited

U.S. PATENT DOCUMENTS 6,420,318 B1 * 7/2002 Holcomb ............. H10N 60/857
428/404
7,482,298 B2 1/2009 Nepela
(Continued)

FOREIGN PATENT DOCUMENTS

EP 1018171 B1 6/2006
WO WO-2017040598 A1 * 3/2017 ............... G01J 1/42

OTHER PUBLICATIONS

Esquinazi, P.D., Precker, C.E., Stiller, M. et al. Evidence for room temperature superconductivity at graphite interfaces. Quantum Stud.: Math. Found. 5, 41-53 (2018). https://doi.org/10.1007/s40509-017-0131-0 (Year: 2017).*
(Continued)

*Primary Examiner* — Jonathan Han
(74) *Attorney, Agent, or Firm* — PCFB, LLC; Justin K. Flanagan

(57) ABSTRACT

A superconductor device includes a high superconductivity transition temperature enhanced from the raw material transition temperature. The superconductor device includes a matrix material and a core material. The enhancing matrix material and the core material together create a system of strongly coupled carriers. A plurality of low-dimensional conductive features can be embedded in the matrix. The low-dimensional conductive features (e.g., nanowires or nanoparticles) can be conductors or superconductors. An interaction between electrons of the low-dimensional con-
(Continued)

ductive features and the enhancing matrix material can promote excitations that increase a superconductivity transition temperature of the superconductor device.

25 Claims, 5 Drawing Sheets

Related U.S. Application Data

(60) Provisional application No. 62/627,168, filed on Feb. 6, 2018.

(56) References Cited

U.S. PATENT DOCUMENTS

| | | | |
|---|---|---|---|
| 8,278,643 B2 | 10/2012 | Bowers | |
| 8,354,323 B2 | 1/2013 | Bowers | |
| 8,426,842 B2 | 4/2013 | Bowers | |
| 8,455,981 B2 | 6/2013 | Bowers | |
| 8,563,965 B2 | 10/2013 | Bowers | |
| 8,703,651 B2 | 4/2014 | Harshman | |
| 8,735,985 B2 | 5/2014 | Bowers | |
| 8,927,969 B2 | 1/2015 | Bowers | |
| 11,785,866 B2 | 10/2023 | Braeuninger-Weimer | |
| 2002/0180006 A1* | 12/2002 | Franz | B82Y 10/00 257/295 |
| 2011/0130292 A1 | 6/2011 | Kawashima | |
| 2016/0093420 A1* | 3/2016 | Urzhumov | H10N 60/80 29/599 |

OTHER PUBLICATIONS

Boukhvalov et al., "Chemical Functionalization of Graphene with Defects," Nano Letters, American Chemical Society, Sep. 25, 2008, vol. 8 , No. 12, pp. 4373-4379.
Buzdin, "Proximity Effects in Superconductor-Ferromagnet Heterostructures," Rev. Mod. Phys., 2005, 77 (3), 935-976.
Cao et al., "Evidence for High TCsuperconducting Transitions in Isolated AI- 45-and AI- 47-Nanoclusters," J. Supercond., Nov. Magn. 2008, 21 (3), 163-166.
Da Silva et al., "Indication of Superconductivity at 35 K in Graphite-Sulfur Composites," Phys. Rev. Lett., 2001, 87 (14), 1-4.
Di Bernardo et al., "P-Wave Triggered Superconductivity in Single-Layer Graphene on an Electron-Doped Oxide Superconductor," Nat. Commun., 2017, 8, 1-9.
Drozdov et al., "Conventional superconductivity at 203 kelvin at high pressures in the sulfur hydride system," Nature, vol. 525, Sep. 3, 2025, p. 73+.
Duan et al., "Pressure-Induced Metallization of Dense (H2S)2H2with High-Tc Superconductivity," Sci. Rep., 2014, 4, 30-32.
Duffe et al., Softlanding and STM Imaging of Ag561 clusters on a C60 monolayer, Eur. Phys. J. D, 2007, 45 (3), 401-408.
Edwards et al., "Abstract: T60.00102: Development of a Nanocluster-Graphene Proximity Device," In Bulletin of the American Physical Society, Mar. 2018 Meeting.
Esquinazi et al., "Evidence for Room Temperature Superconductivity at Graphite Interfaces," Quantum Stud. Math. Found., 2017, 5 (1), 41-53.
Esquinazi, "Invited Review: Graphite and Its Hidden Superconductivity," Pap. Phys., Jan. 2013, 5, 050007.
Gor'kov et al., "Colloquium: High Pressure and Road to Room Temperature Superconductivity," Rev. Mod. Phys., 2018, 90 (1), 11001.
Hartman et al., "Photo-Double-Ionization Mechanisms in Aromatic Hydrocarbons," Phys. Rev. A, 2013, 87 (6), 1-8.
Harshman, et al., "Compressed H3S: inter-sublattice Coulomb coupling in a high-TC superconductor," Institute of Physics Publishing, Nov. 4, 2017, 8 pp., https://doi.org/10.1088/1361-648X/aa80d0.
Harshman, et al., Theory of high-TC superconductivity: transition temperature, Jul. 8, 2011, 17 pp., https://doi.org/10.1088/0953-8984/23/29/295701.
Heersche et al., "Bipolar Supercurrent in Graphene," Nature, 2007, 446 (7131), 56-59.
Hirsch et al., "Meissner effect in nonstandard superconductors," Physica C: Superconductivity and its applications, 2021, 587, 1353896, pp. 1-4.
Jacobberger et al., "Direct Oriented Growth of Armchair Graphene Nanoribbons on Germanium," Nature Communications, Macmillan Publishers Limited, Aug. 10, 2015, 8 pages.
Jiao et al., "Narrow Graphene Nanoribbons from Carbon Nanotubes," Nature, Macmillan Publishers Limited, Apr. 16, 2009, vol. 458, p. 877-880.
Kawashima et al., "Protolytic Decomposition of N-Octane on Graphite at near Room Temperature," Sci. Rep., Jun. 2016, 6, 1-8.
Kawashima, "Observation of the Meissner Effect at Room Temperature in Single-Layer Graphene Brought into Contact with Alkanes," Arch. X, 2018, 1-12.
Kawashima, "Possible Room Temperature Superconductivity in Conductors Obtained by Bringing Alkanes into Contact with a Graphite Surface," AIP Adv., 2013, 3 (5), 052132.
Kim et al., "Remote Epitaxy through Graphene Enables Two-Dimensional Material-Based Layer Transfer," Nature, 2017, 544 (7650), 340-343.
Kimouche et al., "Ultra-Narrow Metallic Armchair Graphene Nanoribbons," Nat. Commun., 2015, 6, 1-6.
Kopelevich et al., "Ferromagnetic-and Superconducting-like Behavior of Graphite," J. Low Temp. Phys., 2000, 119 (5/6), 691-702.
Kopelevich et al., "Landau Level Quantization and Possible Superconducting Instabilities in Highly Oriented Pyrolitic Graphite," Phys. Solid State, 1999, 41 (12), 1959-1962.
Kosynkin et al., "Longitudinal Unzipping of Carbon Nanotubes to Form Graphene Nanoribbons," Nature, Macmillan Publishers Limited, Apr. 16, 2009, vol. 458, pp. 872-877.
Kotov et al., "Electron-Electron Interactions in Graphene: Current Status and Perspectives," Rev. Mod. Phys., 2012, 84(3), 1067-1125.
Kresin et al., "Effects Related to Pair Correlation of p Electrons," J. Chem. Phys., 1975, 63 (8), 3613-3623.
Kresin et al., "Structure and Strengthening of Superconducting Pair Correlation in Nanoclusters," ArchiveX, 2006, 74 (2), 1-44.
Kresin et al., Superconducting State: Mechanism and Properties, Oxford University Press, Oxford, 2014.
Kresin et al., "Shell Structure and Strengthening of Superconducting Pair Correlation in Nanoclusters," Phys. Rev. B, 2006, 74 (2), 1-11.
Kresin, "Pair Correlation Of Superconductive Type in Polycyclic Molecules," Phys. Lett., 1967, 24 (13), 749-750.
Larkins et al., "Evidence of Superconductivity in Doped Graphite and Graphene," Supercond. Sci. Technol., 2015, 29 (1), 15015.
Li et al., "Growth of Adlayer Graphene on Cu Studied by Carbon Isotope Labeling," Nano Lett., 2013, 13 (2), 486-490.
Li et al., "The Metallization and Superconductivity of Dense Hydrogen Sulfide," J. Chem. Phys., 2014, 140 (17).
Little, "Possibility of Synthesizing an Organic Supercondutor," Phys. Rev., 1964, 134 (6A), 1416-1424.
Liu et al., "Magnetization of Potassium-Doped p-Terphenyl and p-Quaterphenyl by High-Pressure Synthesis," Phys. Rev. B, 2017, 96 (22), 1-5.
Mitsuhashi et al., "Superconductivity in Alkali-Metal-Doped Picene," Nature, 2010, 464 (7285), 76-79.
Mousavi et al., "Graphene Nanoribbon Superconductor," J. Low Temp. Phys., 2018, 193 (1-2), 12-20.
Ovchinnikov et al., "Theoretical Investigation of Josephson Tunneling between Nanoclusters," Phys. Rev. B, 2010, 81 (21), 1-6.
Pathak et al., "Possibility of High Tc Superconductivity in Doped Graphene," Arch. X, 2008, 1-6.
PCT Int'l Patent App. No. PCT/US2019/016701, International Search Report mailed Jul. 23, 2019, pp. 1-4.
Precker et al., "Identification of a Possible Superconducting Transition above Room Temperature in Natural Graphite Crystals, " New J. Phys., 2016, 18 (11), 1-18.

(56) References Cited

OTHER PUBLICATIONS

Pumera et al., "Graphane and Hydrogenated Graphene," Chem. Soc. Rev., The Royal Society of Chemistry, 2013, vol. 42 No. 14, pp. 5987-5995.
Savini et al., "First-Principles Prediction of Doped Graphane as a High-Temperature Electron-Phonon Superconductor," Phys. Rev. Lett., 2010, 105 (3), 1-4.
Scheike et al., "Can Doping Graphite Trigger Room Temperature Superconductivity? Evidence for Granular High-Temperature Superconductivity in Water-Treated Graphite Powder," Adv. Mater., 2012, 24 (43), 5826-5831.
Scheike et al., "Granular Superconductivity at Room Temperature in Bulk Highly Oriented Pyrolytic Graphite Samples," Carbon, N.Y., 2013, 59, 140-149.
Senkovskiy et al., "Making Graphene Nanoribbons Photoluminescent", Nano Letters, American Chemical Society, 2017, 17, 7, pp. 4029-4037.
Tonnoir et al., "Induced Superconductivity in Graphene Grown on Rhenium," Phys. Rev. Lett., 2013, 111 (24), 1-5.
Uchoa et al., "Superconducting States of Pure and Doped Graphene," Phys. Rev. Lett., 2007, 98 (14), 1-4.
U.S. Appl. No. 16/268,388, Non-Final Office Action mailed Mar. 3, 2023, 15 pp.
Velasco-Velez et al., "Atmospheric Pressure X-Ray Photoelectron Spectroscopy Apparatus: Bridging the Pressure Gap," Rev. Sci. Instrum., 2016, 87, 053121.
Wang et al., "Superconductivity above 120 Kelvin in a Chain Link Molecule," Arch. X, Mar. 2017, 1-19.
Wehlitz et al., "Photoemission of Cooper Pairs from Aromatic Hydrocarbons," Nov. 2012, 193001, 1-5.
Whangbo, "Probable Cause for the Superconductor-like Properties of Alkane-wetted Graphite and Single-layer Graphene above Room Temperature under Ambient Pressure," Arch. X, 2018, 1-9.
Yan et al., "Observation of Meissner Effect in Potassium-Doped p-Quaterphenyl," Arch. X, Jan. 2018, 1-6.
Yang et al., "Birch Reduction of Graphite. Edge and Interior Functionalization by Hydrogen," J. Am. Chem. Soc., 2012, 134 (45), 18689-18694.
Ye et al., "Liquid-Gated Interface Superconductivity on an Atomically Flat Film," Nat. Mater., 2010, 9 (2), 125-128.

\* cited by examiner

HIGH TEMPERATURE SUPERCONDUCTOR

CROSS-REFERENCE TO RELATED APPLICATIONS

This application is a continuation of U.S. Non-Provisional patent application Ser. No. 16/268,388 filed on Feb. 5, 2019, titled "High Temperature Superconductor," granting as U.S. Pat. No. 11,785,866 on Oct. 10, 2023, which application claims priority to and benefits under 35 U.S.C. § 119 to U.S. Provisional Patent Application No. 62/627,168, filed Feb. 6, 2018, both of which are hereby incorporated by reference in their entireties.

BACKGROUND

Superconductors are materials that exhibit zero electrical resistance and expulsion of magnetic flux fields, under conditions such as being cooled below a critical temperature. The superconductivity phenomenon can be characterized by the Meissner effect, which is a complete ejection of magnetic field lines from the interior of the superconductor as the material transitions into the superconducting state. Superconductors usually have transition temperatures below 30 K. A superconductor is generally considered high-temperature if the material reaches a superconducting state at a temperature that can be cooled by liquid nitrogen ($T_c$>77 K).

SUMMARY

At least one aspect of the present disclosure relates to a superconductor device having a high superconductivity transition temperature enhanced from the intrinsic material transition temperature. The superconductor device includes an enhancing matrix material and a core material. The enhancing matrix material and the core material together create a system of strongly coupled carriers. A plurality of low-dimensional conductive features can be embedded in the matrix. The low-dimensional conductive features (e.g., nanowires, nanoribbons, nanotubes, or nanoparticles) can be conductors or superconductors. An interaction between electrons of the low-dimensional conductive features and the enhancing matrix material can promote excitations that increase a superconductivity transition temperature of the superconductor device.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
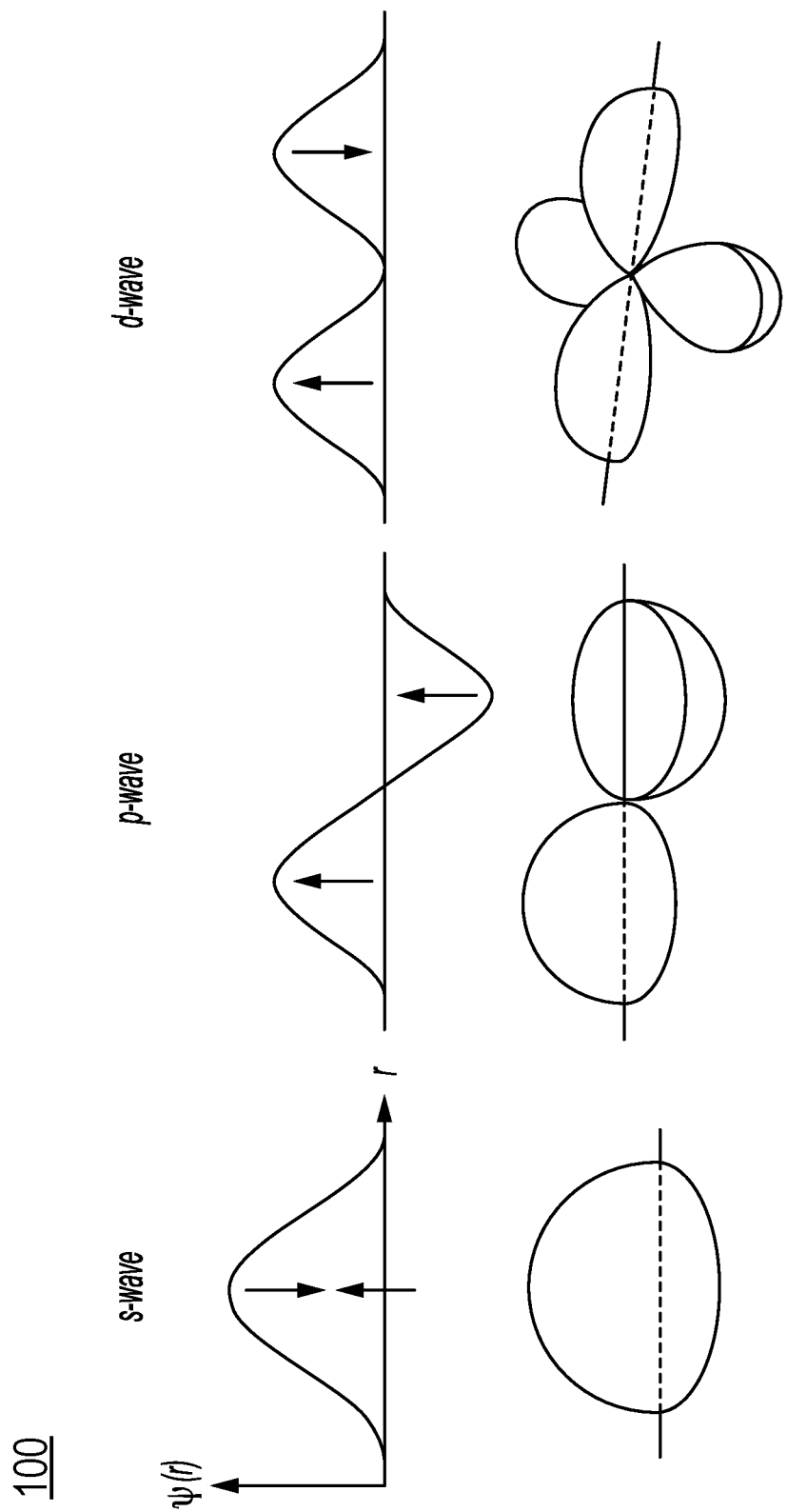
FIG. 1 illustrates symmetry of order parameters for superconductors according to one embodiment.

In the following detailed description, reference is made to the accompanying drawings, which form a part thereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Superconductivity is a highly correlated electronic state of conducting solids that exhibits zero resistance and excludes magnetic flux (which is called Meissner Effect). Isolated electrons repel each other and this repulsion is due to the Coulomb interaction which is usually negative. Superconductivity involves the formation of pairs of electrons (called Cooper Pairs). In most cases, each Cooper pair includes two electrons with opposite spin and momentum that have a net positive or attractive interaction due to their interaction with an excitation that can overcome the Coulomb repulsion.

For most of currently discovered superconductors (more than 10,000 types), this interaction of the Cooper pair is with the vibrations of the atoms (phonons) that make up the lattice that contains the electrons. This electron-phonon interaction can be interpreted as one electron of the Cooper pair polarizing the lattice and the second electron being attracted to that distortion. The $T_c$ (referred to as transition temperature or critical temperature), which is the temperature at or below which the conductor becomes a superconductor, depends mainly on two features of this interaction: the strength of the coupling to a particular phonon mode and the frequency or energy of that mode. If the phonon spectrum is $F(\omega)$ and the coupling to specific frequencies is $\alpha(\omega)^2$, then the integral of $\alpha(\omega)^2 F(\omega)$ can be used to estimate the $T_c$. For most metals, the phonon spectrum does not extend above 15 milli-electron-volts (meV), which corresponds to a transition temperature only as high as 25 K (Kelvin).

Cuprate superconductors are a group of superconductor materials that contain anionic copper complexes. The cuprate superconductors can have transition temperatures as high as 160 K (under pressure), and the phonon spectrum for some of the cuprates can exceed 60 meV. One reason the phonon energies are so large is that the compound contains the light element oxygen and the lighter the mass of the atom the higher the frequency (and energy) of the oscillation. The oxygen oscillations and the coupling of the electrons to the phonons cause the high $T_c$. For example, $T_c$ of 203 K can occur in $H_2S$ under extreme pressure because hydrogen atoms are very light and the phonon energies are very high. The phonon spectrum may approach 100 meV.

The size of a Cooper pair is referred to as superconducting coherence length. For conventional superconductors with $T_c$ less than 20 K, the superconducting coherence length can be several hundred nanometers. However, in general, the size is inversely proportional to the $T_c$. For example, the coherence length in cuprates can be less than 10 nanometers.

The phonon mechanism is responsible for most of currently discovered superconductors but there may be exceptions. There may be several other excitations that can give rise to superconductivity. These excitations involve interactions of the electrons with an electronic excitation that typically is of higher energy than phonons. These excitations include, e.g., plasmons (collective oscillations of the conducting electrons), excitons (excited states of the electrons), and magnetic excitations (e.g., magnons). In addition to these interactions that occur mainly in momentum space, there are also excitations like polarons and bi-polarons (the interaction with the lattice is so strong that the electrons are physically bound to each other) that occur in real space.

For superconductors, the symmetry is not a good quantum number so the symmetries can be described as "like" rather than definitive. FIG. 1 illustrates symmetry of order parameters 100 for superconductors. These symmetries for superconductors are s-like, where the order parameter is close to symmetric, d-like, where the order parameter has two positive and two negative lobes and points in momentum space where the order parameter goes to zero, and p-like, where the paired electrons have the same spin direction (spin triplet) and there are just two lobes. In a more general Eliashberg theory of superconductivity, the phonon mechanism is transparent to the symmetry, and all symmetries are possible within the phonon mechanism. However, magnetic excitations may require a higher order symmetry.

The properties of superconductors, whose overall scale is of the size of the order parameter, can be significantly affected by the surface or an interface with another material. For instance, the interaction of electrons in the superconductor with states within a few nanometers of an interface or surface can significantly affect the transition temperature. For example, Aluminum has a $T_c$ of 1.2 K; while granular aluminum, i.e. aluminum grains surrounded by an aluminum oxide matrix, can have transition temperature several times the native $T_c$ of aluminum. This is the case for several other elemental superconductors.

Furthermore, superconductivity can occur at the interface between two dielectrics when the interface defects cause the interface to become conducting and then superconducting. This effect occurs at relatively low temperatures (a few Kelvin).

In some embodiments, a nanoscale composite of a cuprate superconductor (e.g., the carriers are provided by doping) and an un-doped analog of the cuprate superconductor can be made. The doped regions are separated from the un-doped cuprate by a few nanometers. $T_c$ can be significantly enhanced to as high as room temperature. The reason is that doping the cuprates adds the carriers needed for superconductivity but also adds impurities that can be negative for superconductivity. Combining the doped and un-doped cuprates, the carriers from the doped regions leak (tunnel) into the un-doped regions, and in these regions there are no "pair breakers" and thus can exhibit a much higher $T_c$.

Figure 2A:
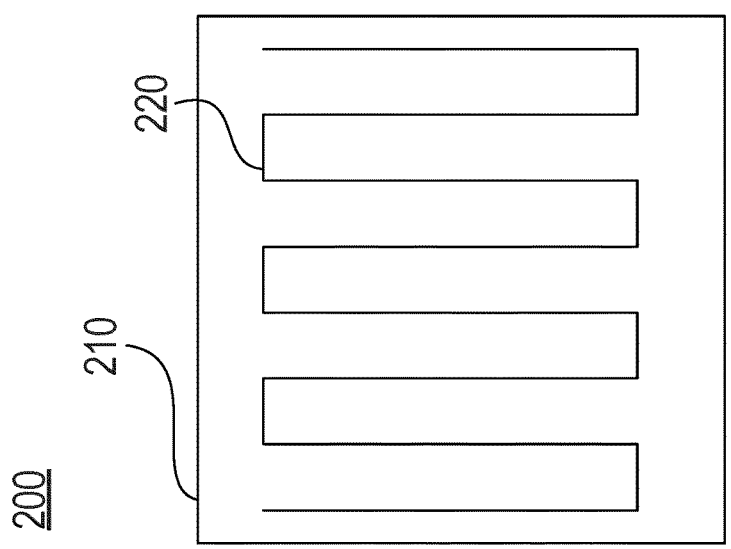
FIGS. 2A-2C schematically illustrates a superconductor device including an enhancing matrix material and a core material according to one embodiment.
Figure 2B:
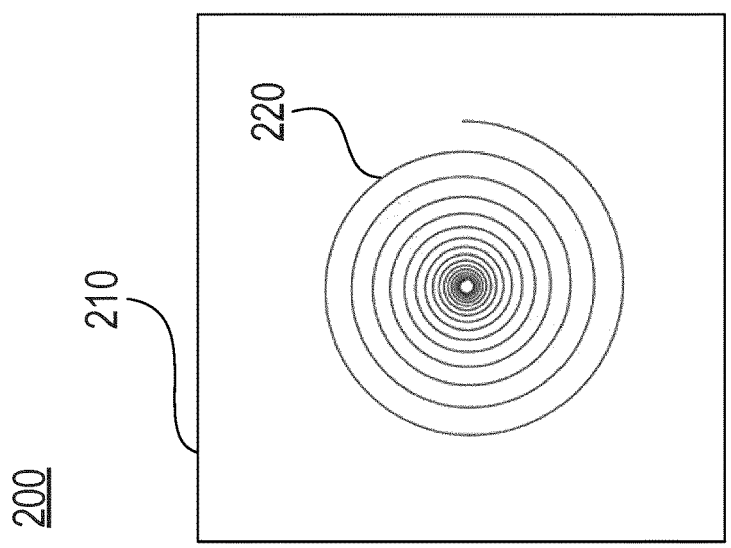
Figure 2C:
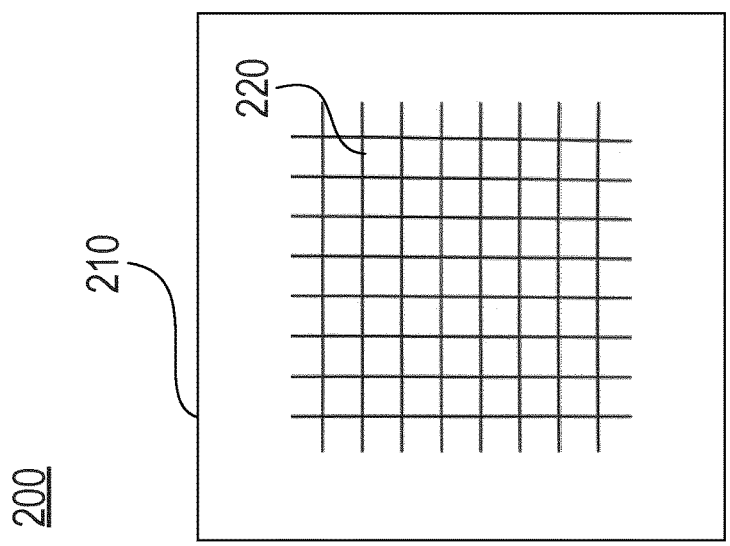

FIGS. 2A-2C schematically illustrates a superconductor device 200 including an enhancing matrix material 210 and a core material 220. A core material 220 can be enhanced by an enhancing matrix material 210 to achieve high temperature superconductivity. According to some embodiments, the superconductor device 200 includes a plurality of low-dimensional conductive features. The low-dimensional conductive feature can have a conductivity different from the conductivity corresponding to a bulk form of the material. The bulk form of the low-dimensional conductive feature can include a material whose electronic properties reflect its bulk electronic properties. Bulk electronic properties are not constrained in a spatial dimension. In contrast, low-dimensional conductive features include materials that have properties that are constrained in a spatial dimension and differ from a bulk form of the material.

The low-dimensional conductive features can be arranged in a pattern. The pattern can include shapes and orientations to promote packing of the low-dimensional conductive features into the enhancing matrix material 210 or a surface of the enhancing matrix material 210. For example, the pattern can include spirals, branches, waves, squares, patches, switchbacks, repeating motifs, stripes, cross-hatches or fractals. The core material 220 and the enhancing matrix material 210 together can create a system of strongly coupled carriers. Coupled carriers are charged particles that interact with each other. These interactions can be caused by one of the fundamental forces, whose strength is given by a dimensionless coupling constant. For example, carriers can include electrons or holes, which are negative and positive charge carriers, respectively. The system of strongly coupled carriers can include a plurality of excitations. For example, excitations can include phonons, high frequency phonons, plasmons, excitons, magnetic excitations, polarons or bi-polarons.

In some embodiments, the enhancing matrix material 210 can be a ferroelectric material. For example, the ferroelectric material can have a spontaneous electric polarization that can be reversed by an application of an external electric field. The ferroelectric material can, together with a core material 220, create a system of strongly coupled carriers. In some embodiments, the enhancing matrix material 210 can be a ferromagnetic material. The ferromagnetic material can, together with a core material 220, create a system of strongly coupled carriers. The core material 220 can include p-wave like superconductor material.

In some embodiments, the core material 220 can include the plurality of low-dimensional conductive features. The low-dimensional conductive features can be embedded in the enhancing matrix material 210. For example, the enhancing matrix material 210 can completely or partially encapsulate the low-dimensional conductive features. The low-dimensional conductive features can include a two-dimensional monolayer, a two-dimensional multilayer stack, one-dimensional nanoscale wires, one-dimensional nanoribbons, one-dimensional nanotubes, or zero-dimensional nanoscale particles. The nanoscale wires can have a diameter that is of an order of a superconducting coherence length of the superconductor device. The nanoscale crystals can have a diameter that is of an order of a superconducting coherence length of the superconductor device. In an exemplary embodiment, the plurality of low-dimensional conductive features are superconductors and a superconductivity transition temperature of the superconductor device is higher than a superconductivity transition temperature of the low-dimensional conductive features. The low-dimensional conductive features can include a defect layer. The low-dimensional conductive features can include a defect (e.g. vacancy defect, interstitial defect, Frenkel defect, antisite defect, and substitutional defect). The low-dimensional conductive features can include a metal, a doped semiconductor, a doped semi-metal, a doped dielectric, a defect state, or defect states at the interface.

In some embodiments, the enhancing matrix material 210 includes a plurality of phonons of a lattice of the enhancing matrix material 210. The plurality of phonons of the lattice of the enhancing matrix material 210 can interact with a plurality of electrons of the plurality of low-dimensional conductive features. In some embodiments, the enhancing matrix material 210 includes an interface adjacent to the plurality of low-dimensional conductive features. A plurality of electrons can couple via phonons across the interface. For example, the enhancing matrix material 210 can include surfaces that are adjacent to surfaces of the low-dimensional conductive features. In some embodiments, the enhancing matrix material 210 includes an interface adjacent to the plurality of low-dimensional conductive features and a plurality of electrons couple via magnons across the interface. In some embodiments, the enhancing matrix material 210 includes a plurality of phonons of a lattice of the enhancing matrix material 210. The plurality of phonons of the lattice of the enhancing matrix material 210 can interact with a plurality of electrons of the plurality of low-dimensional conductive features to cause an increase in a superconductivity transition temperature of the superconductor device. In some embodiments, a plurality of electrons of the plurality of low-dimensional conductive features interact with the enhancing matrix material 210 to cause a plurality of excitations that increase a superconductivity transition temperature of the superconductor device. The plurality of excitations include phonons, plasmons, excitons, magnetic excitations, polarons, or bi-polarons. In some embodiments, an average distance between adjacent features of the plurality of low-dimensional conductive features substantially equals an electron tunneling length, and the superconductor device operates as a homogenous superconductor by tunneling electrons among the plurality of low-dimensional conductive features. The enhancing matrix material 210 can have phonon modes above 30 terahertz (Thz) (e.g., 35 Thz, 40 Thz, 50 Thz, or 60 Thz). The enhancing matrix material 210 can be non-superconducting. The enhancing matrix material 210 can have higher phonon modes than the core material 220.

In some embodiments, superconductivity can be induced or enhanced in a composite material. The composite material can include a plurality of low-dimensional conductive features (e.g., two-dimensional features, one-dimensional features, or zero-dimensional features) embedded in an enhancing matrix material 210. The enhancing matrix material 210 can provide excitations that induce or enhance superconductivity. Inducing or enhancing superconductive can occur when carriers (e.g., electrons or holes) in conducting elements (e.g., low-dimensional conductive features) diffuse or tunnel. Carriers in conducting elements can diffuse when the enhancing matrix material 210 is conducting. Carriers in conducting elements can tunnel when the enhancing matrix material 210 is insulating. Carriers in conducting elements can diffuse or tunnel into the enhancing matrix material 210 and sample excitations (e.g., phonons, magnons, excitons, polarons, biopolarons, or plasmons) at or near the interface (e.g. within 1, 2, 3, 5, or 10 nanometers). For example, if the excitations are phonons then the carriers can interact with phonons in the enhancing matrix material 210 within a few nanometers (e.g. within 1, 2, 3, 5, or 10 nanometers) of the boundary. The phonon spectrum and density of phonon states at or near the interface can be a hybrid or hybridization of the phonons in the materials on both sides of the boundary. The phonons at or near the boundary can reflect the vibrations of the atoms on both sides of the boundary. Superconductivity can be induced or enhanced if the phonons at or near the boundary provide enhanced electron-phonon coupling. Defects at the interface or near the interface can provide additional carriers to enhance the density of carrier states. Enhancing the density of carrier states can induce superconductivity. Superconductivity can occur in the enhancing matrix material 210. Superconductivity can occur in the core material 220. Superconductivity can occur at the interface between the enhancing matrix material 210 and the core material 220.

Figure 3:
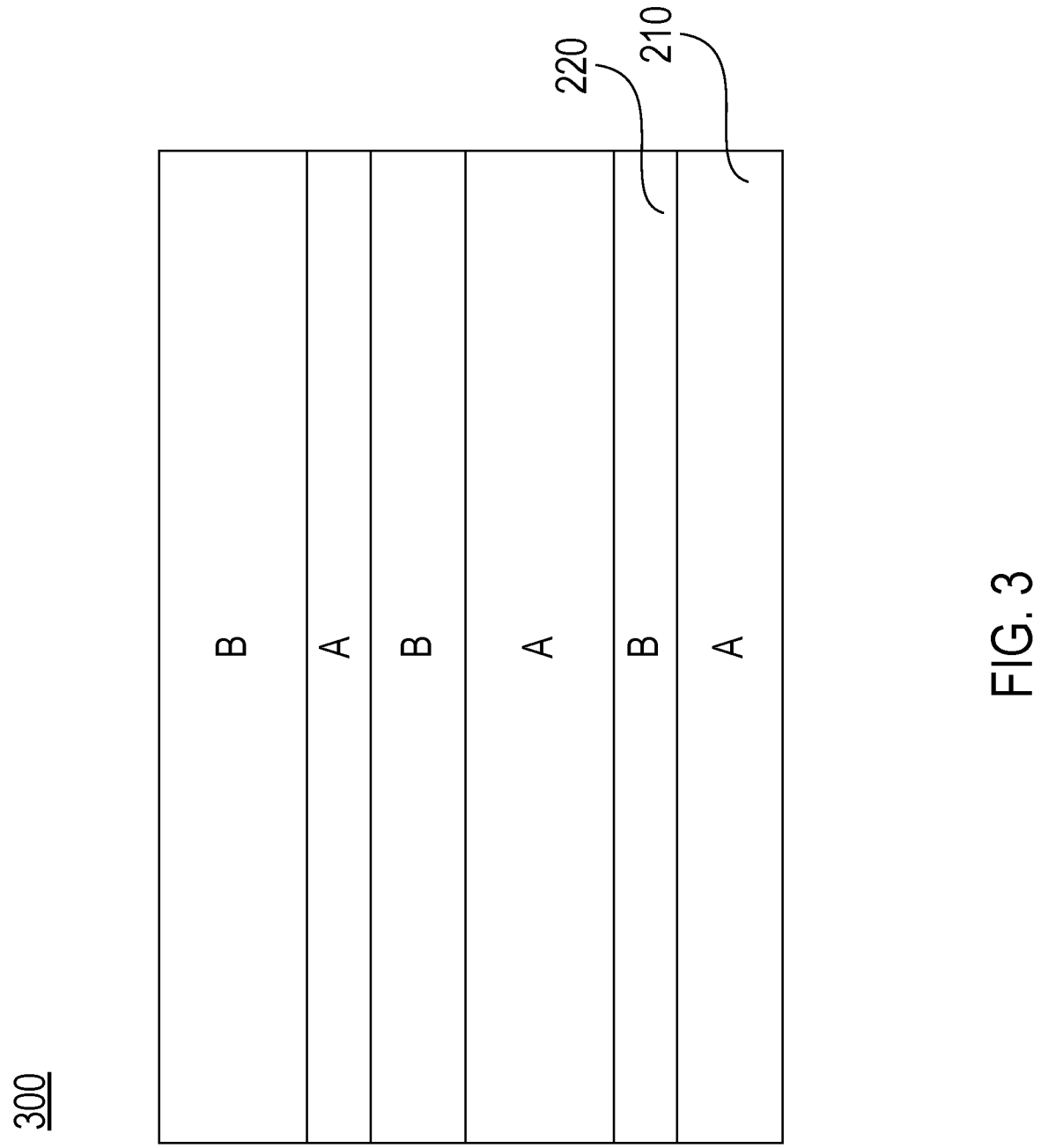
FIG. 3 schematically illustrates a multilayer stack that includes layers of matrix material and layers of core material according to one embodiment.

FIG. 3 schematically illustrates a multilayer stack 300 that includes layers of enhancing matrix material 210 and layers of core material 220. According to some embodiments, the enhancing matrix material 210 and the core material 220 can form a multilayer stack that includes a layer of enhancing matrix material 210 and a layer of core material 220. In some embodiments, the multilayer stack can be at least one or more periods. For example, the enhancing matrix material 210 can be denoted by A and the core material 220 can be denoted by B. The multilayer stack can be at least one period of AB or more periods of AB (such as five periods, represented by ABABABABAB). The thickness of layer A and layer B can be constant or variable across each repeating layer. The thickness of layer A can be the same as or different from the thickness of layer B. The enhancing matrix material 210 and the core material 220 can be compositionally the same or different across each repeating layer. For example, the enhancing matrix material 210 can have more than one variant, such as $A_1$ and $A_2$. The core material 220 can have more than one variant, such as $B_1$ and $B_2$. A multilayer stack can include stacks such as $ABA_2B_2AB_1A_1B$, or any combination of compositional variants of enhancing matrix material 210 or core material 220. The multilayer stack can promote carrier coupling between layers of the multilayer stack. Stacking layers of enhancing matrix material 210 and core material 220 can convert a low-dimensional structure into a structure with higher dimensions. Stacking layers of enhancing matrix material 210 and core material 220 can introduce interfaces for carrier coupling. The multilayer stack can create a system of strongly coupled carriers between the layer of enhancing matrix material 210 and the layer of core material 220. Coupling can occur between layers of enhancing matrix material 210 and core material 220, layers of core material 220, or layers of enhancing matrix material 210. For example, coupling can occur between layers $A_1$ and $A_2$ or $A_1$ and A of a multilayer stack with a stacking of $A_1B_2A_2BAB_3$.

According to some embodiments of the present disclosure, a superconductor can include superconducting wires, nanoribbons, or nanotubes that are embedded in a ferromagnetic matrix. The nanoscale wires, nanoribbons, or nanotubes can be of the order (also referred to as order of magnitude) of the size of the coherence length (e.g., about 5 nanometers in the cuprates). As used herein, the term "order" or "order of magnitude refers to an approximate measure of a size of a number, equal to the logarithm (base 10) rounded to a whole number. For example, A can be of the same order of magnitude of B, if A is more than 0.1*B and is less than 10*B. In order for the ferromagnet to have a positive effect on the $T_c$, the superconductor is a p-wave like superconductor, because the electrons in the ferromagnet are spin-polarized and may not provide an s-wave like order parameter. For example, ferromagnets in contact with conventional s-wave like superconductors will suppress rather than enhance the $T_c$. P-wave like superconductivity is relatively rare and typically the $T_c$ of these superconductors is low.

According to some embodiments of the present disclosure, a superconductor can include nanoscale wires embedded in a ferroelectric matrix. The electron-phonon interaction in a ferroelectric can be strong and the interface can be very conducive to increasing the transition temperature.

In some embodiments, the material that is ferroelectric in an un-doped state may become superconductive by doping. The electron-phonon interaction can be very strong in the material. In some embodiments, a parent insulating compound LaCuO$_4$ can be doped with Sr that provides the carriers to achieve superconductivity.

According to some embodiments of the present disclosure the matrix is a material that has phonon excitations that are higher in energy than the typical ferroelectrics or ferrites. These materials can have an element with low mass. Hydrides are an example of materials that have very high phonon frequencies that can couple to the electrons of the superconductor and may provide the most significant enhancement of the transition temperature. An example of such a hydride is zirconium hydride. Hydrides can also include, for example, aluminium hydride, arsine, beryllium hydride, bismuthine, cadmium hydride, caesium hydride, calcium hydride, calcium monohydride, chromium(II) hydride, cobalt tetracarbonyl hydride, copper hydride, digallane, digermane, diisobutylalumium hydride, germane, indium trihydride, iron hydride, iron tetracarbonyl hydride, iron(I) hydride, iron(II) hydride, lithium aluminum hydride, lithium hydride, magnesium hydride, magnesium iron hexahydride, magnesium monohydride, magnesium nickel hydride, mercury(I) hydride, mercury(II) hydride, metal carbonyl hydride, molybdocene dihydride, nickel hydride, palladium hydride, plumbane, plutonium hydride, potassium hydride, rubidium hydride, scandium hydride, scandium(III) hydride, sodium aluminum hydride, sodium bis(2-methoxyethoxy)aluminium hydride, sodium hydride, stannane, stibine, thallium hydride, titanium hydride, titanium(IV) hydride, tributyltin hydride, tiphenyltin hydride, uranium hydride, yttrium hydride, zinc hydride, zirconium(II) hydride. Hydrides can include transition metal hydrides (e.g., binary metal hydrides, ternary metal hydrides, coordination complexes, or cluster hydrides).

According to some embodiments, an enhancing matrix material 210 can be a transition metal hydride. According to some embodiments, an enhancing matrix material 210 can be a liquid aromatic hydrocarbons, for example, methane and ethane. According to some embodiments, an enhancing matrix material 210 can be a polymer. An enhancing matrix material 210 can be a polymer with high phonon frequency modes. For example, a polymer with high phonon frequency modes can include polyethylene (PE) or poly(vinyl alcohol) (PVA). An enhancing matrix material 210 can be an amorphous polymer. An enhancing matrix material 210 can be a crystalline polymer. An enhancing matrix material 210 can be a branched polymer. According to some embodiments, an enhancing matrix material 210 can be ice. The enhancing matrix material 210 can be ice doped or alloyed by other materials. The enhancing matrix material 210 can be crystalline ice or amorphous ice.

According to some embodiments of the present disclosure multilayers of the superconductor and the matrix can be formed in order to further enhance the transition temperature of the composite superconductor. The enhancement can occur because more sides of the superconductor can interact with excitations (phonons, plasmons, excitons, magnetic excitations, polarons, or bi-polarons) in the enhancing matrix materials 210.

According to some embodiments of the present disclosure, other than the nanoscale wires, other lower dimensional (at least one dimension smaller than the superconducting coherence length) superconductors (or conductors) can be embedded in a matrix for increasing the T$_c$ of the superconductor. The lower dimensional materials can be, e.g., two-dimensional layers, one-dimensional wires (e.g., nanoscale wires), one-dimensional nanoribbons, or zero-dimensional nanoparticles or nanocrystals. In some embodiments, the two-dimensional superconductors or conductors can include two-dimensional free-standing layers (e.g., graphene) that are stacked between layers of other two-dimensional materials (e.g., MoS$_2$ or hexagonal BN) in a repeated fashion. The multilayer stack of conducting (or superconducting) layers have atomically small dimensions in the tunneling direction.

In some embodiments, the one-dimensional wires and the zero-dimensional nanoparticles or nanocrystals may provide more density of states for the carriers (e.g., electrons) at Fermi energy than the two-dimensional monolayers. The higher density of states at Fermi energy leads to a better superconductivity.

In condensed matter systems, electrons in one material can couple across an interface with phonons from the neighboring material. The electron-phonon interaction causes excitation that gives rise to the superconducting state. Ferroelectric materials are strongly correlated materials that are very conducive to a concomitantly strong electron phonon interaction but are generally insulators. Embedding a conducting (e.g., metallic) or superconducting nano-wire or nano-particle (or two-dimensional multilayer stack) in this insulating matrix provides the additional electron-phonon coupling as the electrons can tunnel back and forth into the ferroelectric material and back into the superconductor, enhancing the electron-phonon interaction as well as the superconducting transition temperature. The superconducting coherence length is typically inversely proportional to the transition temperature, so the higher the initial T$_c$, the smaller the nano-structure can be to raise the T$_c$.

There is another factor for achieving a practical high T$_c$ superconductor. The distance between the nano-wires or nano-particles can be small enough so that electrons can tunnel from one nano-structure to another. In this way the composite can behave as a bulk superconductor and the superconducting properties of this composite can be as good as if the composite were a homogeneous superconductor.

Figure 4:
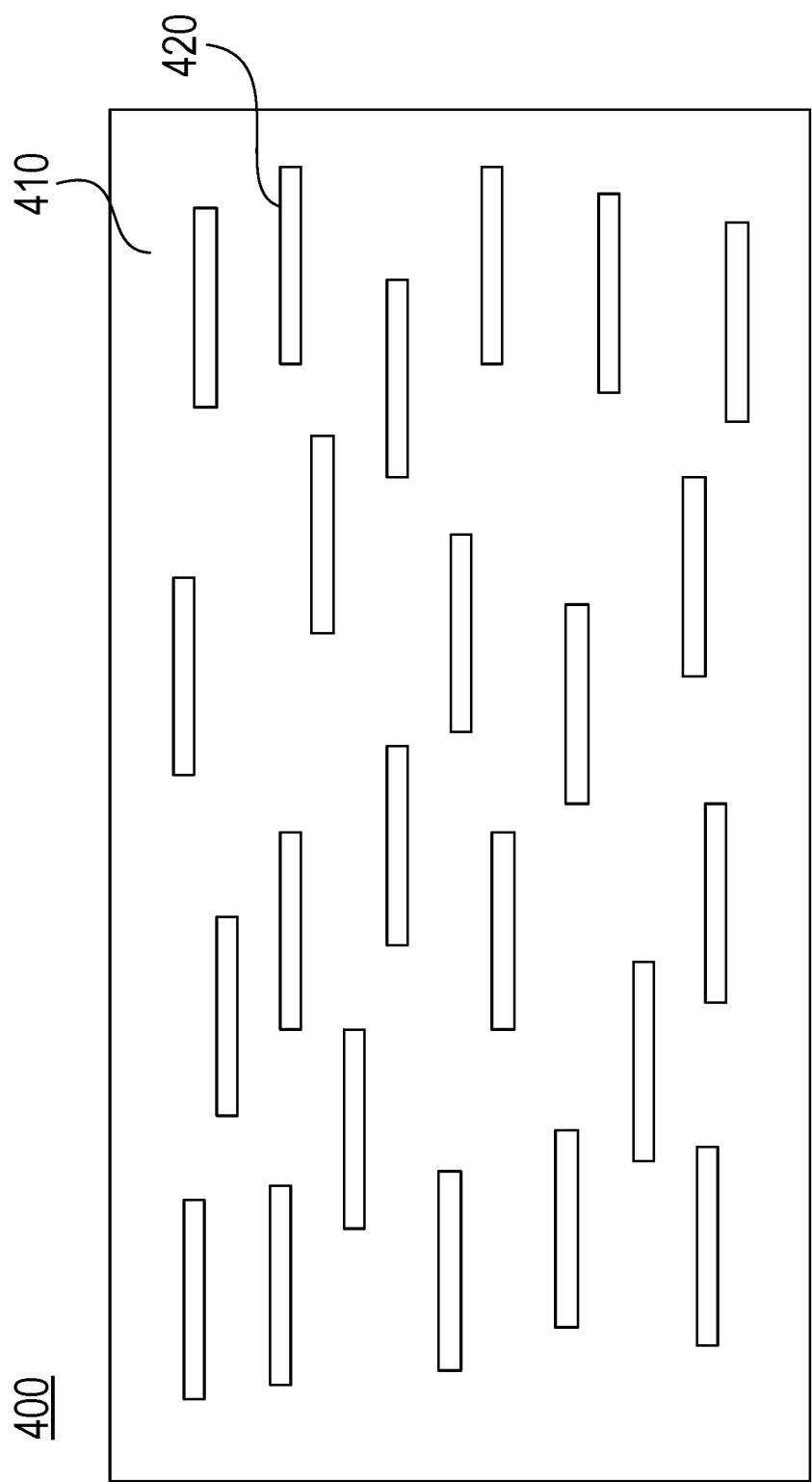
FIG. 4 schematically illustrates a superconductor device including nanoscale wires embedded in a matrix according to one embodiment.

FIG. 4 schematically illustrates a superconductor device including nanoscale wires embedded in a matrix. The superconductor device 400 includes a matrix 410 and a plurality of nanoscale wires 420 embedded in the matrix 410. The matrix 410 can be an enhancing matrix material 210. The plurality of nanoscale wires 420 can be a core material 220. The material of the nanoscale wires 420 can be a conductor such as a metal, a doped semiconductor, or a doped semimetal (or even a superconductor material). The nanoscale wires 420 have an average diameter that is of an order of a superconducting coherence length of the superconductor device 400. For example, the average diameter can be, e.g., from about 2 nanometers to about 4 nanometers, from about 1 nanometer to about 10 nanometers, or from about 0.5 nanometers to about 20 nanometers depending on the starting T$_c$ of the wires.

The matrix 410 can be, e.g., a ferroelectric matrix, ferromagnetic matrix or a matrix that has intrinsically high phonon frequencies (energies). The ferroelectric matrix can include, e.g., barium titanate, bismuth titanate, colemanite, europium barium titanate, ferroelectric polymers, germanium telluride, langbeinite, lead scandium tantalite, lead titanate, lead zirconate titanate, lithium niobate, polar metal, polyvinylidene fluoride, potassium niobate, potassium sodium tartrate, potassium titanyl phosphate, sodium bismuth titanate, strontium titanate (SrTiO$_3$) or strontium barium titanate (SrBaTiO$_3$). In some embodiments, the matrix is a ferrite like cobalt iron oxide or an antiferromagnetic multiferroic like bismuth iron oxide. The matrix can also be a hydride that intrinsically has high phonon frequencies or energies like zirconium hydride, ice, or polymers.

Electrons of the nanoscale wires 420 couple across an interface with phonons from at least a portion of the matrix 410 that is adjacent to the nanoscale wires 420. The interaction between electrons of the nanoscale wires 420 and phonons of the lattice of the matrix 410 causes excitations that increase a superconductivity transition temperature of the superconductor device 400. In some embodiments, the transition temperature can be increased to a temperature level close to, at, or above room temperature. As used herein, the term "room temperature" refers to a temperature of at least 273 K. In some other embodiments, instead of phonons, the electrons of the nanoscale wires 420 can interact with other excitations from the matrix such as plasmons, excitons, magnetic excitations, polarons, or bi-polarons.

An average distance between adjacent nanoscale wires 420 substantially equals an electron tunneling length, so that the superconductor device 400 operates as a homogenous superconductor by tunneling electrons among the nanoscale wires 420. The electron tunneling length can be, e.g., from about 1 nm to about 10 nm. In some embodiments, the robustness of the electron tunneling depends on the temperature and the distances between adjacent nanoscale wires 420. In general, a higher temperature specifies a shorter electron tunneling length.

Figure 5:
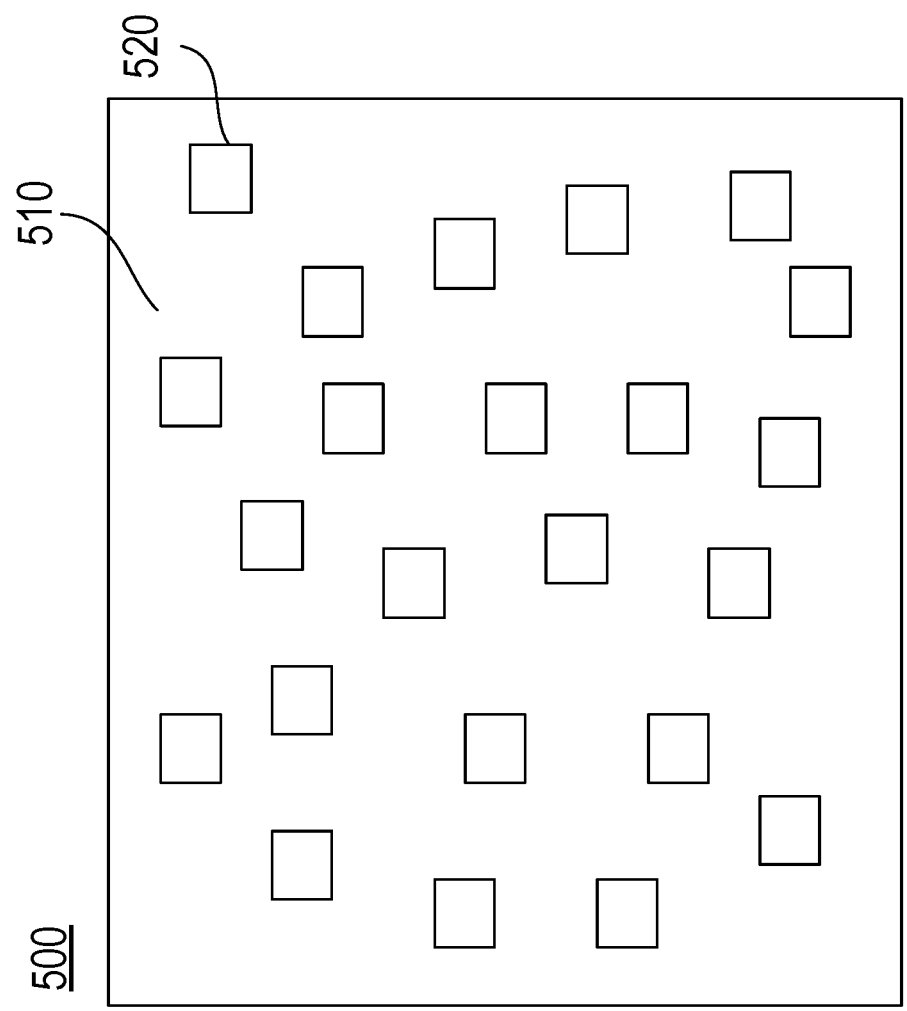
FIG. 5 schematically illustrates a superconductor device including nanoscale particles embedded in a matrix according to one embodiment.

FIG. 5 schematically illustrates a superconductor device including nanoscale particles embedded in a matrix. The superconductor device 500 includes a matrix 510 and a plurality of nanoscale particles 520 (or nanoscale crystals) embedded in the matrix 510. The matrix 510 can be an enhancing matrix material 210. The plurality of nanoscale particles 520 can be a core material 220. The material of the nanoscale particles 520 can be a conductor such as a metal, a doped semiconductor, or a doped semimetal (or even a superconductor material). The nanoscale particles 520 have an average diameter that is of an order of a superconducting coherence length of the superconductor device 500. For example, the average diameter can be, e.g., from about 2 nanometers to about 4 nanometers, from about 1 nanometer to about 10 nanometers, or from about 0.5 nanometers to about 20 nanometers depending on the starting transition temperature of the superconducting nanoparticle (also referred to as raw material transition temperature).

The matrix 510 can be, e.g., a ferroelectric matrix or a ferromagnetic matrix. The ferroelectric matrix can include, e.g., barium titanate, bismuth titanate, colemanite, europium barium titanate, ferroelectric polymers, germanium telluride, langbeinite, lead scandium tantalite, lead titanate, lead zirconate titanate, lithium niobate, polar metal, polyvinylidene fluoride, potassium niobate, potassium sodium tartrate, potassium titanyl phosphate, sodium bismuth titanate, strontium titanate ($SrTiO_3$) or strontium barium titanate ($SrBaTiO_3$).

Electrons of the nanoscale particles 520 couple across an interface with phonons from at least a portion of the matrix 510 that is adjacent to the nanoscale particles 520. The interaction between electrons of the nanoscale particles 520 and phonons of the lattice of the matrix 510 causes excitations that increase a superconductivity transition temperature of the superconductor device 500. In some embodiments, the transition temperature can be increased to a temperature level close to, at, or above room temperature.

In some other embodiments, instead of phonons, the electrons of the nanoscale particles 520 can interact with other excitations from the matrix such as plasmons, excitons, magnetic excitations, polarons, or bi-polarons.

An average distance between adjacent nanoscale particles 520 substantially equals an electron tunneling length, so that the superconductor device 500 operates as a homogenous superconductor by tunneling electrons among the nanoscale particles 520.

In an exemplary embodiment, a high temperature (e.g., room temperature) superconductor can be achieved using a high-permeability material. The superconductor can be achieved by embedding wires (e.g., nano-wires) of high temperature superconductor (HTSC) material in material having a high magnetic permeability. In some embodiments, the wire diameter can be substantially equal to, or be close to, a size of the Cooper pair. Such a superconductor suppresses undesired current fluctuations, and thereby increases $T_c$ and increases the inductance of the wires. For reference, e.g., an induction effect of a wire of 1 μm in vacuum can yield a 2000-fold increase in the electron effective mass. For achieving room temperature superconductivity, the frequency response may be in a terahertz (THz) range (e.g., 300 K at a frequency of 6 THz). The electrons can interact with the phonons that correspond to lattice vibrations at 6 THz. The magnetic response of ferrites falls off in a microwave X band (e.g., $\mu<2$ at a frequency of 10 GHz). In some embodiments, a magnetic metamaterial (e.g., a split-ring resonator) can be used to achieve the THz frequency response.

In an exemplary embodiment, a high temperature (e.g., room temperature) superconductor can be achieved using a high-permittivity material. The superconductor can be achieved by embedding wires (e.g., nano-wires) of HTSC material in a material having a high permittivity (e.g., a barium strontium titanate (BST) material). In some embodiments, the wire diameter is can substantially equal, or be close to, a size of the Cooper pair. Such a superconductor screens undesired current fluctuations, and thereby increases $T_c$. The screening of the current fluctuations may be caused by displacement currents instead of conduction currents. In some embodiments, for achieving the room temperature superconductivity, the frequency response is the THz range (e.g., 300 K at a frequency of 6 THz).

In an exemplary embodiment, a high temperature (e.g., room temperature) superconductor can be achieved by building an array of wires that whose intrinsic inductance and wire to wire capacitance are resonant at the plasma frequency of the wires. This represents an array structure that is embedded in the superconducting material. In some embodiments, the superconductor material may a conventional, low-Ta superconductor material. The wires may have a diameter of, e.g., 1 μm. The wires may be separated by a distance of, e.g., 1 cm. At least partially due to the wire inductance, the wire array embedded in the superconductor material may yield an electron effective mass that is increased by a factor of, e.g., 2000, corresponding to a plasma frequency of about 10 GHz, which is comparable to a gap frequency of the superconductor. The electron effective mass is the mass that the electrons seem to have when responding to forces. In other words, the behavior of the electrons can be modeled as free particles having the electron effective mass. The electron effective mass is a function of the band structure of the material forming the superconductor. The plasmon mode may be the massive mode associated with a gauge symmetry breaking of the superconductor (i.e., the Higgs mode). Lowering the Higgs mass to the energy scale of the superconductor excitations may yield novel behavior, including a magnetic interaction between Cooper pairs in adjacent wires. The number of wires N penetrated by an external magnetic field, which is the equivalent of the London penetration depth, can be given as $N \sim \ln(a/r)$; where a is a spacing with wires and r is the wire radius. In other words, the London penetration depth can be governed by the same scaling as the plasma frequency.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

The construction and arrangement of the elements of the systems and methods as shown in the embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and/or assemblies disclosed herein may be constructed from any of a wide variety of materials that provide sufficient strength or durability, in any of a wide variety of colors, textures, and combinations. The order or sequence of any process or method steps may be varied or re-sequenced, according to alternative embodiments. Other substitutions, modifications, changes, and omissions may be made in the design, operating conditions, and arrangement of the preferred and other embodiments without departing from scope of the present disclosure or from the spirit of the appended claims.

What is claimed is:

1. A superconductor device, comprising:
   an enhancing matrix material, wherein the enhancing matrix material comprises a polymer; and
   a core material, wherein the core material and the enhancing matrix material together create a system of strongly coupled carriers.

2. A superconductor device, comprising:
   an enhancing matrix material, wherein the enhancing matrix material is ice; and
   a core material, wherein the core material and the enhancing matrix material together create a system of strongly coupled carriers.

3. The superconductor device of claim 2, wherein the core material comprises a plurality of low-dimensional conductive features.

4. The superconductor device of claim 1, wherein superconductivity occurs in the core material.

5. A superconductor device, comprising:
   an enhancing matrix material, wherein the enhancing matrix material comprises zirconium hydride; and
   a core material, wherein the core material and the enhancing matrix material together create a system of strongly coupled carriers.

6. The superconductor device of claim 1, wherein a superconductivity transition temperature of the superconductor device is at least 273 K.

7. The superconductor device of claim 1, wherein the core material comprises a plurality of low-dimensional conductive features.

8. A superconductor device, comprising:
   an enhancing matrix material comprising:
      a ferroelectric enhancing matrix material that has a spontaneous electric polarization that can be reversed by application of an external electric field, and
      at least one additional matrix material, selected from the group of matrix materials consisting of: zirconium hydride, ice, and a polymer; and
   a core material, wherein the core material and the enhancing matrix material together create a system of strongly coupled carriers.

9. The superconductor device of claim 8, wherein the core material comprises a plurality of low-dimensional conductive features.

10. A superconductor device, comprising:
    an enhancing matrix material comprising:
       a ferromagnetic enhancing matrix material, and
       at least one additional matrix material, selected from the group of matrix materials consisting of: zirconium hydride, ice, and a polymer; and
    a core material that includes a p-wave like superconductor material, wherein the core material and the enhancing matrix material together create a system of strongly coupled carriers.

11. The superconductor device of claim 10, wherein the core material comprises a plurality of low-dimensional conductive features.

12. A superconductor device, comprising:
    an enhancing matrix material comprising at least one matrix material, selected from the group of matrix materials consisting of: zirconium hydride, ice, and a polymer; and a core material comprising a plurality of low-dimensional conductive features, wherein the core material and the enhancing matrix material together create a system of strongly coupled carriers.

13. The superconductor device of claim 12, wherein the low-dimensional conductive features are embedded in the enhancing matrix material.

14. The superconductor device of claim 12, wherein the plurality of low-dimensional conductive features includes at least one of: a two-dimensional conductive monolayer, a two-dimensional multilayer stack, one-dimensional conductive nanoscale wires, one-dimensional nanoribbons, zero-dimensional nanoscale particles, or zero-dimensional nanoscale crystals.

15. The superconductor device of claim 12, wherein the plurality of low-dimensional conductive features includes nanoribbons, the nanoribbons having a width that is of an order of a superconducting coherence length of the superconductor device.

16. The superconductor device of claim 12, wherein the plurality of low-dimensional conductive features includes nanotubes, the nanotubes having a diameter that is of an order of a superconducting coherence length of the superconductor device.

17. The superconductor device of claim 12, wherein the plurality of low-dimensional conductive features includes nanoscale wires, the nanoscale wires having a diameter that is of an order of a superconducting coherence length of the superconductor device.

18. The superconductor device of claim 12, wherein the plurality of low-dimensional conductive features includes nanoscale particles, the nanoscale particles having a diameter that is of an order of a superconducting coherence length of the superconductor device.

19. The superconductor device of claim 12, wherein the plurality of low-dimensional conductive features includes nanoscale crystals, the nanoscale crystals having a diameter that is of an order of a superconducting coherence length of the superconductor device.

20. The superconductor device of claim 12, wherein the plurality of low-dimensional conductive features are superconductors, and a superconductivity transition temperature of the superconductor device is higher than a superconductivity transition temperature of the plurality of low-dimensional conductive features.

21. The superconductor device of claim 12, wherein the plurality of low-dimensional conductive features includes at least one of a metal, a doped semiconductor, or a doped semi-metal.

22. The superconductor device of claim 12, wherein the enhancing matrix material includes a plurality of phonons of a lattice of the enhancing matrix material, the plurality of phonons of the lattice of the enhancing matrix material to interact with a plurality of electrons of the plurality of low-dimensional conductive features.

23. The superconductor device of claim 12, wherein the enhancing matrix material includes an interface adjacent to the plurality of low-dimensional conductive features and wherein a plurality of electrons couple via phonons across the interface.

24. The superconductor device of claim 12, wherein the enhancing matrix material includes a plurality of phonons of a lattice of the enhancing matrix material to interact with a plurality of electrons of the plurality of low-dimensional conductive features to cause an increase in a superconductivity transition temperature of the superconductor device.

25. The superconductor device of claim 12, wherein a plurality of electrons of the plurality of low-dimensional conductive features interact with the enhancing matrix material to cause a plurality of excitations that increase a superconductivity transition temperature of the superconductor device.

* * * * *